United States Patent
Gale et al.

(10) Patent No.: US 8,745,467 B2
(45) Date of Patent: Jun. 3, 2014

(54) SYSTEM AND METHOD FOR FAULT TOLERANT COMPUTING USING GENERIC HARDWARE

(75) Inventors: Alan A. Gale, Windham, ME (US); Andrew L. Kling, Foxboro, MA (US); Mark E. Timperley, East Greenwich, RI (US); Lawrence T. Bass, Coventry, RI (US); John J. Lavallee, Wrentham, MA (US); George W. Cranshaw, Assonet, MA (US); Alan M. Foskett, Mansfield, MA (US)

(73) Assignee: Invensys Systems, Inc., Foxboro, MA (US)

( * ) Notice: Subject to any disclaimer, the term of this patent is extended or adjusted under 35 U.S.C. 154(b) by 247 days.

(21) Appl. No.: 13/396,198

(22) Filed: Feb. 14, 2012

(65) Prior Publication Data

US 2012/0210199 A1    Aug. 16, 2012

Related U.S. Application Data

(63) Continuation-in-part of application No. 13/029,102, filed on Feb. 16, 2011, now Pat. No. 8,516,355.

(51) Int. Cl.
*H03M 13/00* (2006.01)
*G06F 11/10* (2006.01)
*G06F 11/16* (2006.01)

(52) U.S. Cl.
CPC ........ *G06F 11/1076* (2013.01); *G06F 11/1008* (2013.01); *G06F 11/1633* (2013.01); *G06F 11/1658* (2013.01)
USPC .............................. 714/770; 714/4.11; 714/12

(58) Field of Classification Search
CPC ........................ G06F 11/1076; G06F 11/1008; G06F 11/1633; G06F 11/1658
USPC ........................................ 714/770, 4.11, 4.12
See application file for complete search history.

(56) References Cited

U.S. PATENT DOCUMENTS 6,470,462 B1 * 10/2002 Karlsson et al. ................. 714/11
6,868,092 B1 * 3/2005 Bell et al. ...................... 370/503

(Continued)

FOREIGN PATENT DOCUMENTS

| EP | 1283468 A2 | 2/2003 |
| EP | 1426862 A2 | 6/2004 |
| WO | 03001395 A2 | 1/2003 |

OTHER PUBLICATIONS

European Search Report regarding related application serial No. EP 12155519.7, dated Jun. 14, 2012, 5 pgs.

*Primary Examiner* — Esaw Abraham
(74) *Attorney, Agent, or Firm* — Edward S. Jarmolowicz, Esq.

(57) ABSTRACT

A dual redundant process controller is provided. The controller comprises a process control application that executes on a first and a second module. When executed by the first module, a first application instance writes a first synchronization information to the second module, reads a second synchronization information from the first module, and, when the second disagrees with the first synchronization information after passage of a time-out interval, performs a resynchronization function; and wherein, when executed by the second module, the second application instance writes the second synchronization information to the first module, reads the first synchronization information from the second module, and, when the first disagrees with the second synchronization information after passage of the time-out interval, performs the resynchronization function. The first application instance calls the synchronization function provided by the multitasking real-time operating system before invoking a set events function provided by a multitasking real-time operating system.

10 Claims, 4 Drawing Sheets

(56) References Cited

U.S. PATENT DOCUMENTS

| | | | |
|---|---|---|---|
| 7,039,827 B2 * | 5/2006 | Meyer et al. | 714/4.11 |
| 7,235,597 B2 * | 6/2007 | Lee et al. | 524/120 |
| 7,363,531 B2 * | 4/2008 | Vecoven | 714/6.31 |
| 7,437,614 B2 * | 10/2008 | Haswell et al. | 714/38.13 |
| 7,617,259 B1 * | 11/2009 | Muth et al. | 1/1 |
| 7,620,845 B2 * | 11/2009 | Endo | 714/12 |
| 7,640,451 B2 * | 12/2009 | Meyer et al. | 714/4.11 |
| 8,479,037 B1 * | 7/2013 | Chatterjee et al. | 714/4.11 |
| 2010/0241909 A1 | 9/2010 | Niino | |
| 2012/0210198 A1 | 8/2012 | Gale et al. | |

* cited by examiner

SYSTEM AND METHOD FOR FAULT TOLERANT COMPUTING USING GENERIC HARDWARE

CROSS-REFERENCE TO RELATED APPLICATIONS

The present application is a continuation-in-part of and claims priority to U.S. patent application Ser. No. 13/029,102, filed on Feb. 16, 2011, now U.S. Pat. No. 8,516,355, titled "System and Method for Fault Tolerant Computing Using Generic Hardware" by Gale et al, which is incorporated herein by reference in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Process control systems may be implemented to automatically control industrial processes based on pre-defined logic and/or rules. Industrial processes may be carried out by motors, valves, heaters, pumps, and the like, which may be referred to as process devices or field devices, in manufacturing plants, refineries, food processing plants, and other plants. The process control systems may monitor parameters and/or properties of on-going processes by receiving outputs from sensors coupled to the processes, for example temperature sensors, pressure sensors, motion sensors, weight sensors, density sensors, flow rate sensors, and other sensors. Automated control devices, for example controllers, may adjust and control process devices based on the sensed parameters and properties based on pre-defined logic and/or command inputs from, for example, a human machine interface.

Current methodologies for use in control system redundancy commonly include triple modular redundancy (TMR) with voting at all interfaces and/or various Not Swap methods where an active module controls all processes and a standby module is ready to take over in the event of any failure. TMR approaches typically allow all three legs of the controller to participate in a voted change to the end stations with all members having an equal vote and 2 out of 3 voting to resolve slight timing differences. TIM may verify votes at all endpoints in the system. This may entail tripling at least some hardware components in the controller, increasing cost and customized voting at endpoints increasing end point complexity. Hot swap methods rely on the active device self-diagnosing a fault and shutting down to allow the standby module to be promoted to the active role. Such hot swap methods may entail erroneous values being applied to the process until diagnostics detect a faulty active module, the faulty active module being shut down, and the standby module being promoted to active.

Other current systems can utilize a dual-active approach which does not require end-point voting. For example, two control modules can execute the same sequence of operations and produce the same process settings and/or commands. Settings and/or commands produced by the two control modules can be verified by communications hardware to be in agreement prior to forwarding on to other devices, for example to controlled process devices. In an embodiment, this approach may entail dedicated hardware for synchronization of state, Clock synchronization, and comparison of message content.

The current systems as well as those described herein may be implemented on a processor forming a part of a computer. As will be appreciated by one skilled in the art, computers and computer systems may come in different shapes, sizes, and implements. At the same time, computers and/or computer systems may be said to comprise some common elements and have some common optional elements. For example, a computer system may comprise a processor (which may be referred to as a central processor unit or CPU) that is in communication with memory devices including secondary storage, read only memory (ROM), random access memory (RAM), input/output (I/O) devices, and network connectivity devices. The processor may be implemented as one or more CPU chips.

It is understood that by programming and/or loading executable instructions onto the computer system, at least one of the CPU, the RAM, and the ROM are changed, transforming the computer system in part into a particular machine or apparatus having the novel functionality taught by the present disclosure. It is fundamental to the electrical engineering and software engineering arts that functionality that can be implemented by loading executable software into a computer can be converted to a hardware implementation by well known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage is typically comprised of one or more disk drives or tape drives and is used for non-volatile storage of data and as an over-flow data storage device if RAM is not large enough to hold all working data. Secondary storage may be used to store programs which are loaded into RAM when such programs are selected for execution. The ROM is used to store instructions and perhaps data which are read during program execution. ROM is a non-volatile memory device which typically has a small memory capacity relative to the larger memory capacity of secondary storage. The RAM is used to store volatile data and perhaps to store instructions. Access to both ROM and RAM is typically faster than to secondary storage. The secondary storage, the RAM, and/or the ROM may be referred to in some contexts as computer readable storage media and/or non-transitory computer readable media.

I/O devices may include printers, video monitors, liquid crystal displays (LCDs), touch screen displays, keyboards, keypads, switches, dials, mice, track balls, voice recognizers, card readers, paper tape readers, or other well-known input devices.

The network connectivity devices may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. These network connectivity devices may enable the processor to communicate with the Internet or one or more intranets. With such a network connection, it is contemplated that the processor might receive information from the network, or might output information to the network in the course of performing the above-described method steps. Such information, which is often represented as a sequence of instructions to be executed using processor, may be received from and outputted to the network, for example, in the form of a computer data signal embodied in a carrier wave.

Such information, which may include data or instructions to be executed using processor for example, may be received from and outputted to the network, for example, in the form of a computer data baseband signal or signal embodied in a carrier wave. The baseband signal or signal embodied in the carrier wave generated by the network connectivity devices may propagate in or on the surface of electrical conductors, in coaxial cables, in waveguides, in an optical conduit, for example an optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, may be generated according to several methods well known to one skilled in the art. The baseband signal and/or signal embedded in the carrier wave may be referred to in some contexts as a transitory signal.

The processor executes instructions, codes, computer programs, scripts which it accesses from hard disk, floppy disk, optical disk (these various disk based systems may all be considered secondary storage), ROM, RAM, or the network connectivity devices. While only one processor is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage, for example, hard drives, floppy disks, optical disks, and/or other device, the ROM, and/or the RAM may be referred to in some contexts as non-transitory instructions and/or non-transitory information.

In an embodiment, the computer system may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system to provide the functionality of a number of servers that is not directly bound to the number of computers in the computer system. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having computer usable program code embodied therein to implement the functionality disclosed above. The computer program product may comprise data structures, executable instructions, and other computer usable program code. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system, at least portions of the contents of the computer program product to the secondary storage, to the ROM, to the RAM, and/or to other non-volatile memory and volatile memory of the computer system. The processor may process the executable instructions and/or data structures in part by directly accessing the computer program product, for example by reading from a CD-ROM disk inserted into a disk drive peripheral of the computer system. Alternatively, the processor may process the executable instructions and/or data structures by remotely accessing the computer program product, for example by downloading the executable instructions and/or data structures from a remote server through the network connectivity devices. The computer program product may comprise instructions that promote the loading and/or copying of data, data structures, files, and/or executable instructions to the secondary storage, to the ROM, to the RAM, and/or to other non-volatile memory and volatile memory of the computer system.

In some contexts, a baseband signal and/or a signal embodied in a carrier wave may be referred to as a transitory signal. In some contexts, the secondary storage, the ROM, and the RAM may be referred to as a non-transitory computer readable medium or a computer readable storage media. A dynamic RAM embodiment of the RAM, likewise, may be referred to as a non-transitory computer readable medium in that while the dynamic RAM receives electrical power and is operated in accordance with its design, for example during a period of time during which the computer is turned on and operational, the dynamic RAM stores information that is written to it. Similarly, the processor may comprise an internal RAM, an internal ROM, a cache memory, and/or other internal non-transitory storage blocks, sections, or components that may be referred to in some contexts as non-transitory computer readable media or computer readable storage media.

SUMMARY

In an embodiment, a dual redundant process controller is disclosed. The process controller comprises a first processor, a first memory, and a first instance of a process control application stored in the first memory. The process controller further comprises a second processor, a second memory, and a second instance of the process control application stored in the second memory. When executed by the first processor, the first instance of the process control application writes a first synchronization information to the second memory, reads a second synchronization information from the first memory, and, when the second synchronization information disagrees with the first synchronization information after passage of a predetermined time-out interval, performs a resynchronization function. When executed by the second processor, the second instance of the process control application writes the second synchronization information to the first memory, reads the first synchronization information from the second memory, and, when the first synchronization information disagrees with the second synchronization information after passage of the predetermined time-out interval, performs the resynchronization function.

In an embodiment, a method of transmitting a data message is disclosed. The method comprises forming a first payload and a first cyclic redundancy check (CRC) by a first processor of a dual redundant process controller and forming a second payload and a second cyclic redundancy check by a second processor of the dual redundant process controller. The method further comprises comparing the first cyclic redundancy check to the second cyclic redundancy check by the first processor and, when the first cyclic redundancy check and the second cyclic redundancy check agree, transmitting the data message comprising the first payload and the first cyclic redundancy check.

In an embodiment, a process controller is disclosed. The process controller comprises a first module. The first module comprises a first processor executing a multitasking real-time operating system and a high-level data link control (HDLG) communication controller coupled to the first processor. The first processor forms a first message comprising a first data payload and a first cyclic redundancy check (CRC) and transmits the first message to the high-level data link control communication controller. The high-level data link control communication controller receives the first message, transmits the first message to a field device, calculates a second cyclic redundancy check based on the message, and, when the second cyclic redundancy check is different from the first cyclic redundancy check, transmits an error message to the first processor.

In an embodiment, a dual redundant process controller is disclosed. The controller comprises a first processor, a first memory, a first instance of a multitasking real-time operating system (RTOS), and a first instance of a process control application stored in the first memory. The controller further comprises a second processor, a second memory, a second instance of the multitasking real-time operating system, and a second instance of the process control application stored in the second memory. When executed by the first processor in a context provided by the first instance of the multitasking real-time operating system, the first instance of the process control application writes a first synchronization information to the second memory using a synchronization function provided by the first instance of the multitasking real-time operating system, reads a second synchronization information from the first memory, performs a resynchronization function when the second synchronization information disagrees with the first synchronization information after passage of a predetermined time-out interval, and calls the synchronization function provided by the first instance of the multitasking real-time operating system before invoking a set events function provided by the first instance of the multitasking real-time operating system. When executed by the second processor, the second instance of the process control application writes the second synchronization information to the first memory using the synchronization function provided by the second instance of the multitasking real-time operating system, reads the first synchronization information from the second memory, and performs the resynchronization function when the first synchronization information disagrees with the second synchronization information after passage of the predetermined time-out interval.

In an embodiment, a dual redundant process controller is disclosed. The controller comprises a first processor, a first memory, a first instance of a process control application stored in the first memory. The controller further comprises a second processor, a second memory, and a second instance of the process control application stored in the second memory. When executed by the first processor, the first instance of the process control application forms a first payload and a first cyclic redundancy check (CRC), compares the first cyclic redundancy check with a second cyclic redundancy check determined by the second instance of the process control application based on a second payload formed by the second instance of the process control application that executes on the second processor, and transmits the first payload and the first cyclic redundancy check when the first cyclic redundancy check compares with the second redundancy check.

In an embodiment, a dual redundant process controller is disclosed. The controller comprises a first processor, a first memory, a first instance of a multitasking real-time operating system (RTOS), and a first instance of a process control application stored in the first memory. The controller further comprises a second processor, a second memory, a clock, a second instance of the multitasking real-time operating system, and a second instance of the process control application stored in the second memory. When executed by the first processor in a context provided by the first instance of the multitasking real-time operating system, the first instance of the process control application writes a first synchronization information indicating a clock tick synchronization to the second memory using a synchronization function provided by the first instance of the multitasking real-time operating system. When executed by the second processor, the second instance of the process control application adjusts the clock based on the first synchronization information stored in the second memory.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
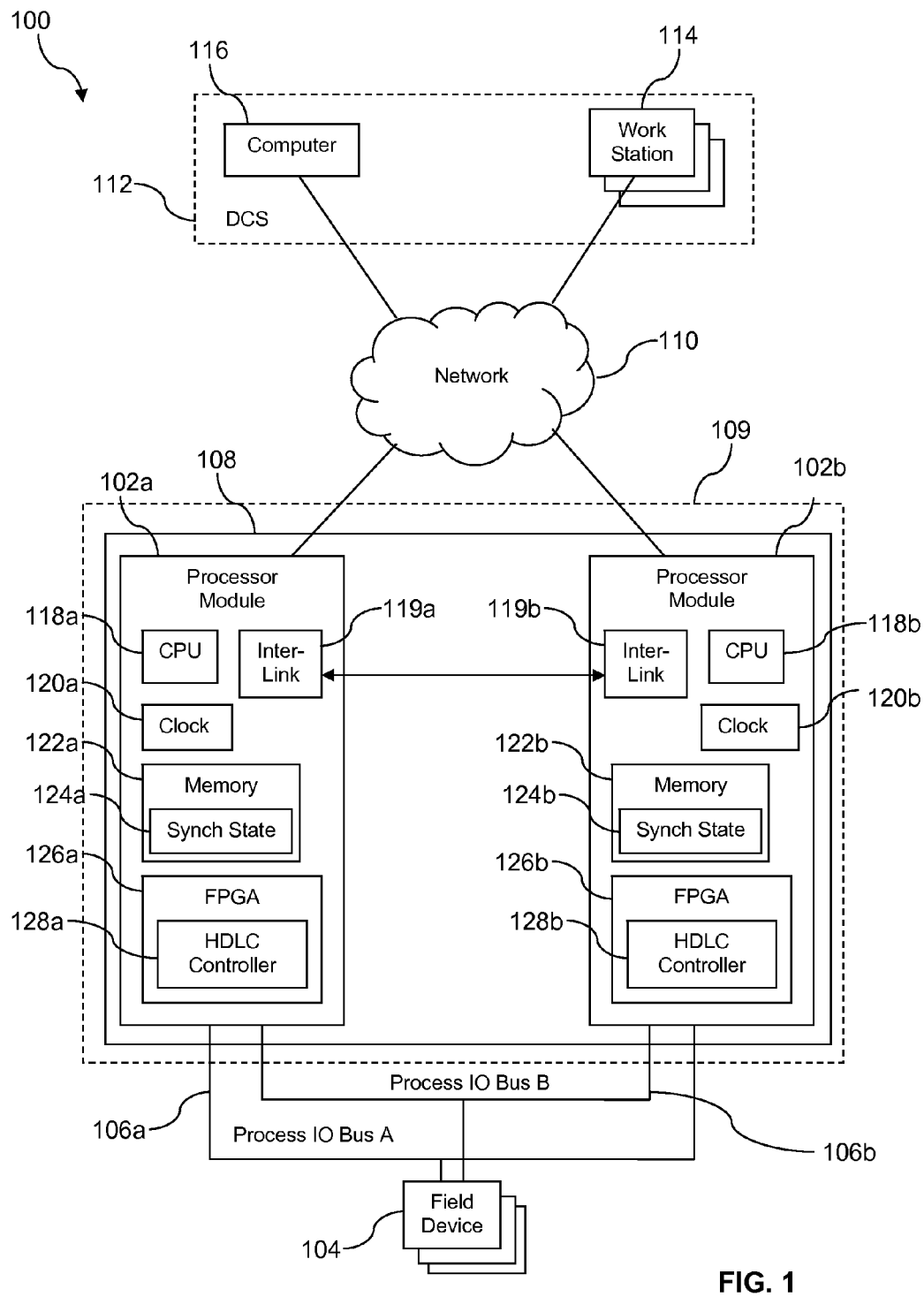
FIG. 1 is a block diagram of a process control system according to an embodiment of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

A dual redundant process controller is taught herein. In an embodiment, the process controller is suitable for use in a high reliability real-time process control environment. The process controller may be used to monitor and control a variety of process devices or field devices such as valves, pumps, motors, heaters, and other devices. The process controller may be used in manufacturing plants, refineries, chemical plants, food processing plants, and other plants. Process controllers may cause considerable damage should they fail. Failed process controllers may injure plant personnel. Failed process controllers may damage machinery or material. It will be further appreciated that process controllers desirably receive commanded inputs, receive sensed values of parameters and/or properties, determine appropriate control outputs, and transmit these control outputs timely and at appropriately scheduled times.

The process controller comprises two modules, each suitable for providing the process control function. During operation, a first module operates as a primary module that receives sensor inputs from the process devices, transmits control outputs to the process devices, and transmits messages to human machine interfaces (HMI), workstations, and/or higher tier automated control devices in accordance with a control application and/or control computer program. The second module operates as a shadow module that receives the same sensor inputs from the process devices, determines but does not transmit control outputs to the process devices, and determines but does not transmit messages to the HMIs, workstations, and/or higher tier automated control devices in accordance with the same control application. The first module and the second module may execute separate instances of the same control application. Should the first module experience a failure or error, it is desirable that this failure be detected and that the second module assumes the role of the primary module promptly.

To support a seamless exchange of role in the event of a failure, it is further desirable that the first module and the second module execute the same instructions in the control application at substantially the same time and follow the same execution path through the control application, with the exception of selective instructions that only the primary module executes or that only the shadow module executes. The two modules execute synchronization instructions at designated points in the control application instruction sequence. When performing a synchronization instruction, the first module writes information into a pre-defined memory location associated with the second module identifying the synchronization state of the first module, and the second module writes information into a pre-defined memory location associated with the first module identifying the synchronization state of the second module. If the synchronization state of the sibling module does not agree with synchronization state of the subject module within a pre-defined time-out interval, the subject module declares a synchronization error and executes a recovery routine. If the synchronization states agree, each module continues executing control instructions. By inserting synchronization instructions at appropriate points in the code, the separate execution of the same control application by the two modules may be kept synchronized, within design limits.

Each module comprises a clock that governs the pace of instruction execution by the module. In an embodiment, the control application executed by the module in the shadow role determines a clock difference between the shadow module and the primary module, based on the synchronization operation, and adjusts the clock of the shadow module to align with the clock of the primary module. This clock adjustment permits defining the synchronization time-out interval to a shorter duration and contributes to reducing synchronization wait times, thereby increasing the processing efficiency of at least one of the modules.

When outputting information to the HMIs, workstations, and/or higher tier automated control devices, the primary module and the shadow module each create a data payload and calculate a cyclic redundancy check (CRC) over the data payload. In some contexts the data payload may be referred to as a message body. The shadow module sends the CRC value that it has calculated to the primary module. If the CRC value calculated by the shadow module agrees with the CRC value calculated by the primary module, the primary module transmits a message comprising both the data payload and the CRC value to the HMIs, workstations, and/or higher tier automated control devices. When the CRC values do not agree, the primary module executes a recovery routine.

In an embodiment, each of the primary module and the shadow module comprises a complex programmable logic device (CPLD) that executes the control application and a high level data link control (HDLC) controller that may transceive messages to the control devices, for example when the subject module is executing in role of the primary module. The CPLD determines a data payload and a first CRC over the data payload and sends a message comprising the data payload and the CRC to the HDLC controller. The HDLC controller transmits the message to the appropriate control device and concurrently receives the same message. The HDLC controller calculates a second CRC over the data payload that it transmitted, and if the first CRC and the second CRC disagree, the HDLC controller sends an error message to the CPLD. This procedure may promote the CPLD identifying an error in the message output to the control device and retransmitting the message more rapidly than would be the case if the HDLC controller simply timed out when the control device did not timely return an acknowledgement to the HDLC controller.

The disclosure teaches a synchronization functionality that does not depend on dedicated hardware based state machines. Instead a message-based synchronization method is employed to keep all operations in two separate operating system environments the same, for example in two separate processor modules. The two processor modules exchange a message-based synchronization step which can be performed at the critical junctures in the Operating System and Application code on a standard Gigabit Ethernet link between the two modules.

The disclosure further teaches implementation of the synchronization functionality using software that provides for the exchange of stack level CRCs prior to message transmission, for example message transmission to a higher level control component and/or to a field device. This allows software to detect any difference in the process settings without hardware comparison. These CRCs may already be an integral part of common stack methodology but herein they are used only for application layer verification. The disclosure teaches using these CRCs to verify content match in the dual active controllers. The two members in a pair of modules verify correct context by both examining the CRC (which expresses content) of the others transmission, which allows generic hardware to achieve the same functionality as dedicated purpose built hardware with comparison logic. The ability to use generic hardware may provide a variety of advantages in some circumstances, for example promoting more flexible and maintainable hardware designs, promoting use of a wider variety of commercially available components, and other advantages.

The disclosure further teaches dynamically adjusting clocks to reduce accumulated clock skew. It may be difficult, in general, to maintain synchronization of two modules with the Operating System Clocks timing out at different intervals as defined by internal timers. Previous systems created specialized clocking circuits to derive the operating system clock from both modules and interrupt the signal from a single source to remove any skew. The methodology taught herein dynamically adjusts the clock timeout interrupt on one of the processor modules to match the period of the other processor module. This is done through deterministic timeout modification via the synchronization messages.

Turning now to FIG. 1, a system 100 is described. The system 100 comprises a first processor module 102a, a second processor module 102b, a field device 104, a process input output (IO) bus A 106a, a process IO bus B 106b, and a baseplate 108. In some contexts, the first processor module 102a and the second processor module 102b and the baseplate 108 may be referred to as a dual redundant process controller 109 and/or a dual redundant processor. Alternatively, the processor modules 102 and the baseplate 108 may be referred to as a control processor, a unit controller, or a controller. In an embodiment, the processor modules 102 communicate with a distributed control system (DCS) 112 via a network 110. The DCS 112 may comprise one or more workstations 114 and a computer system 116. While in FIG. 1 the dual redundant process controller 109 and the DCS 112 are shown separately to promote ease of understanding and to focus attention on the dual redundant process controller 109, it is understood that the DCS 112 could alternatively be abstracted to comprise the dual redundant process controller 109.

In an embodiment, the network 110 provides dual communication paths from the first processor module 102a to the DCS 112 so that if one of the communication paths is unavailable for any reason, for example due to a failure, the first processor module 102a may still communicate with the DCS 112 over the other communication path. The network 110 likewise may provide dual communication paths from the second processor module 102b to the DOS 112. In an embodiment, the network 110 may provide the dual communication paths at least in part using a plurality of switches to provide a mesh of switches and/or a mesh of communication paths. The network 110 further may comprise one or more signal splitters to assure that a message transmitted to the processor module 102 operating in primary mode is also transmitted to the processor module 102 operating in shadow mode. The network 110 may link the processor modules 102 with the DCS 112 via any of wireless links, wired links, and/or fiber links. In an embodiment, the network 110 may be any of a public network, a private network, and/or a combination thereof.

The processor modules 102 control the field device 104 and monitor one or more parameters of the field device 104 via process IO buses 106. The process IO buses 106 provide dual communication paths from the processor modules 102 to the field device 104 so that if one of the communication paths is unavailable for any reason, for example due to a loose connection, a cut wire or cable or interrupted wireless link, the processor modules 102 may still communicate with the field device 104 over the other communication path. The processor module 102 operating in primary mode both monitors one or more parameters of the field device 104 and sends control commands to the field device 104 via the process IO buses 106. The processor module 102 operating in shadow mode monitors one or more parameters of the field device 104 and also monitors the control commands sent by the processor module 102 that is operating in primary mode. In an embodiment, the processor module 102 operating in shadow mode does not send control commands to the field device 104.

While one field device 104 is labeled in FIG. 1, it is understood that the processor modules 102 may control and monitor a plurality of field devices 104. The field devices 104 comprise any of a variety of plant equipment, process equipment, manufacturing equipment, and other equipment. The field devices 104 may be referred to as devices and/or process devices in some contexts. The field devices 104 may comprise a logic component coupled to one or more electro-mechanical devices, for example a valve, a pump, a motor, a heater, a conveyor, and other devices. The logic component of the field devices 104 may further be coupled to one or more sensors to sense an operational parameter of the electro-mechanical device or of a physical parameter with which the electro-mechanical device interacts, for example a pressure, a temperature, a density, or other characteristic or property. In some cases, the field devices 104 may comprise a logic component coupled to one or more sensors but not to any electro-mechanical device.

In combination with the processor modules 102 and the DCS 112, the field devices 104 may aggregately provide an automated process such as a chemical production process, an oil refining process, a glass manufacturing process, a food production process, an electrical power generation process, and/or other processes. In an embodiment, the processor modules 102 control the field devices 104 in accordance with a command provided by the computer system 116 and transmit parameter values to the computer 116 and optionally to the work stations 114. The computer system 116 may execute a high level process control application or to monitor and control a plurality of dual-redundant processors that in turn control and monitor a plurality of field devices 104. In some contexts, the computer system 116 may be referred to as a high tier automated control device.

Each of the processors 102 executes a copy of the same computer program and/or control application. Said in other words, the processors 102 each execute an instance of the same computer program. In an operating mode, one of the processors 102 executes in a primary mode, and the other processor 102 executes in a shadow mode. The following description may assume that the first processor module 102a executes in the primary mode and the second processor module 102b executes in the shadow mode, but it is understood that the roles of the processor modules 102 may be reversed. Particularly, under a fault condition the program executed by the processor modules 102 may identify the fault and coordinate swapping primary/shadow roles between the processor modules 102, as will be discussed further hereinafter.

The processor module 102 that executes in primary mode transmits commands to the field device 104 and transmits parameter values to the DCS 112. The processor module 102 that executes in shadow mode receives the commands transmitted by the processor module 102 that executes in primary mode and receives the parameter values transmitted by the processor module 102 that executes in primary mode. Both processor modules 102 receive the commands transmitted by the DCS 112 and receive the parameter values transmitted by the field device 104.

The computer system 116 may comprise one or more computers that execute a high level process control application that interacts with the dual redundant process controller 109. Computer systems are discussed in detail hereinafter. The computer system 116 may provide high level control inputs to the dual redundant process controller 109, for example an oven temperature set point control input. The dual redundant process controller 109 may control the field device 104, for example a plurality of thermistors that modulate the electrical power consumed by resistive heater elements and hence the heat emitted by the resistive heater elements, based on the high level oven temperature set point control input and based on sensor oven temperature values received from the field device 104. In an embodiment, the computer system 116 may be a high reliability computer system, and the communication link between the computer system 116 and the network 110 may be provided by dual communication paths.

The workstations 114 may also be implemented as computers. One of the workstations 114 may provide a human machine interface (HMI) functionality. The workstations 114 promote monitoring the controlled process and/or processes by users and/or plant operators. The workstations 114 may further promote the users and/or plant operators transmitting inputs to the computer system 116 to select operating modes of the controlled process or processes and/or to input commanded values of some process parameters. One or more of the workstations 114 may communicate with the dual redundant process controller 109 independently of the computer system 116, for example in a maintenance mode of operation and/or in a test mode of operation.

The processor modules 102 desirably execute the same instructions of the control program at substantially the same time, for example within a predefined difference of execution times. This may be referred to as synchronous execution of instructions by the processor modules 102 and/or as synchronous operation of the processor modules 102. It is understood that while in some contexts the term synchronous may be used to mean exactly simultaneous occurrence of events, as used herein 'synchronous' means substantially simultaneous within a predefined threshold of timing difference, for example within about 2 ms of time difference or time offset. By executing the same instructions synchronously, that is within a predefined threshold of timing difference, the difficulty of recovering from an error by the primary processor and/or the swapping of roles between the processor modules 102 may be reduced.

To promote synchronous operation, the control program includes a number of synch instructions distributed among the instructions of the control program. When one of the processor modules 102 executes a synch instruction of the control program—recalling that both processor modules 102 execute an instance of the same control program—it writes a synch message into a memory of the other processor module 102 and waits to read a corresponding synch message written into its own memory by the other processor module 102 before continuing processing of subsequent instructions. If either processor module 102 does not read the expected synch message in its memory within a predetermined period of time, for example 2 ms, the subject processor module 102 performs a fault recovery action. In some contexts, the predetermined period of time may be referred to as a predetermined time-out interval.

In an embodiment, the first processor module 102a comprises a first central processor unit (CPU) 118a, a first interlink 119a, a first clock 120a, a first memory 122a, and a first field programmable gate array (FPGA) 126a. The first field programmable gate array 126a comprises and/or embodies a first high level data link (HDLC) controller 128a. It is understood that a field programmable gate array is a species of complex programmable logic device (CPLD). In another embodiment, another species of CPLD that is not an FPGA may be used in the place of the first FPGA 126a. Alternatively, a logic device other than a CPLD may be used in the place of the FPGA 126a, for example an application specific integrated circuit (ASIC), a microcontroller, a microprocessor, or other electronic logic component. In an embodiment, the functionality of the FPGA 126a and the HDLC controller 128a may be implemented in separate components rather than integrated as described herein. The first memory 122a may comprise a first synch state memory location 124a. The first processor module 102a may be implemented on one circuit board, on two circuit boards, or on a higher number of circuit boards, and these one or more circuit boards may be enclosed in a package such as an electronic equipment box.

In an embodiment, the second processor module 102b comprises a second central processor unit 118b, a second interlink 119b, a second clock 120b, a second memory 122b, a second FPGA 126b, and a second HDLC controller 128b. The second memory 122b may comprise a second synch state memory location 124b. The second processor module 102b may be implemented on any number of circuit boards that may be enclosed in a package such as an electronic equipment box. The comments on implementing alternative embodiments of the first processor module 102a apply equally to the second processor module 102b but are not repeated here in the interests of brevity. In an embodiment, the baseplate 108 may provide mechanical structure to secure and mount the processor modules 102, to secure connectors, and to carry supporting components, for example a power supply or other components.

In an embodiment, both of the processor modules 102 execute a multi-tasking real-time operating system (RTOS), and the control application that both processor modules 102 execute is executed in a context provided by the RTOS. For example, the central processing units 118 execute instantiations of the control application in a multi-tasking real-time operating system that also executes on the central processing units 118. Some commercially available RTOSs include the Nucleus RTOS sold by the Embedded Systems Division of Mentor Graphics of Wilsonville, Oreg.; VxWorks sold by Wind River Systems of Alameda, Calif.; one or more RTOSs sold by Green Hills Software of Santa Barbara, Calif.; and others. RTOSs may also be custom developed by an organization when developing the control application and the dual redundant process controller 109. Without limitation, a multi-tasking RTOS may generally be expected to provide deterministic prioritized task scheduling such that a higher priority task that is ready for processing will not wait on a lower priority task to complete processing. In an embodiment, a commercially available RTOS may be extended to provide a synch instruction call for use by the control program. Alternatively, a software routine may be developed that promotes the synch message generation and transmission functionality, possibly using one or more RTOS system calls to complete the transmission of the synch message. This software routine may be written in such a way that it can be invoked in any of a plurality of tasks, subroutines, modules, and/or other components of the control application.

When the first processor module 102a executes a synch instruction it writes a first synch message into the second synch state memory location 124b of the second memory 122b associated with the second processor module 102b. This first synch message identifies a synchronization state of the first processor module 102a, an enumerated value corresponding to one of a number of different synchronization state values. In some contexts, a synchronization state value may be referred to as a state value and a synchronization state may be referred to as a state. In some contexts, the synchronization state value and possibly other data may be referred to as synchronization information.

Other data may comprise a synch instruction sequence number or identity number. Because the control application may comprise many synch instructions, for example hundreds of synch instructions or thousands of synch instructions, simply processor module 102a to the second processor module 102b, which may be referred to in some contexts as hot remarrying. The context may include register values and/or stack values maintained by the first processor module 102a. Alternatively, or in addition, the resynchronization procedure may comprise swapping roles between the first processor module 102a and the second processor module 102b, so the processor module 102 formerly operating in primary mode transitions to operation in shadow mode, and the processor module 102 formerly operating in shadow mode transitions to operation in primary mode.

The sharing of state values described above may be said to implement a state sequencer of the dual redundant processor. In some contexts, it may be said that the control application comprises or implements a state sequencer. The state sequencer function of the control application tracks the state of the subject processor module 102 and promotes maintaining synchronization with the corresponding processor module 102.

In an embodiment, the first processor module 102a writes the first synch message to the second synch state memory location 124b in the second memory 122b and the second processor module 102b writes the second synch message to the first synch state memory location 124a in the first memory 122a via a one gigabit (1G) Ethernet communication link that is provided between the processor modules 102 by the system 100. For example, the first interlink 119a in the first processor module 102a provides a first standard communication port that couples to a second standard communication port in the second interlink 119b in the second processor module 102b to provide a communication link between the processor modules 102 to promote the synchronization function. In another embodiment, the transmission of synch messages is provided using a different communication link. In an embodiment, the synch messages may be formatted as an identifying a state value may not sufficiently locate the point of processing the control application. Information that combines both a state value and a sequence number or other identifying information may be useful for uniquely identifying a point of execution in the control application.

The state value that the first processor module 102a writes to the second synch state memory location 124b provides an indication of what instruction of the common control application the first processor module 102a has recently executed, and the second processor module 102b can analyze that indication to determine if the processor modules 102 are in synchronization. In an embodiment, a synch message may be sent when an RTOS clock tick event occurs, and in this case the synchronization information may identify the RTOS clock tick event rather than a synchronization state. In another embodiment, the RTOS clock tick event may be handled and/or treated as one among a plurality of synchronization state values.

In an embodiment, there are eight different state values or sync values, but in another embodiment, there may be either fewer or more different state values. A first state value may correspond to a clock interrupt, for example a clock interrupt generated by the clock 120 and/or an RTOS clock tick event. This also may be referred to as an operating system tick or OS tick state value. A second state value may correspond to a process input/output bus interrupt, for example associated with an interrupt or input being received from the field device 104. A third state value may correspond to a reel-time operating system task switch. A fourth state value may correspond to sending a message from the primary processor module 102 to the DCS 112 and/or the computer system 116. A fifth state value may correspond to an external time synchronization. A sixth state value may correspond to an event of receiving a message from the DCS 112. A seventh state value may correspond to a message exchange. An eighth state value may correspond to a request to resynchronize the processor modules 102, which may be referred to as a marriage request.

When the second processor module 102b executes a synch instruction, likewise, it writes a second synch message identifying a synchronization state of the second processing module 102b into the first synch state memory location 124a of the first memory 122a associated with the first processor module 102a. The state value that the second processor module 102b writes to the first synch state memory location 124a provides an indication of what instruction of the common control application the second processor module 102b has recently executed, and the first processor module 102a can analyze that indication to determine if the processor modules 102 are in synchronization.

After either processor module 102 writes the synch message to the synch state memory location 124 of its correlate processor module 102, it waits a predefined period of time for the state value in its own synch state memory location 124 to match what it wrote. If a state value match is not determined before the expiration of the predefined period of time or predefined time-out interval, the subject processor module 102 may declare that the correlate processor module 102 is out of synchronization and may begin a recovery routine to resynchronize the two processor modules 102. The expiration of the predefined period of time or predefined time-out interval may be referred to in some contexts as timing out or synchronization timing out.

The code example below shows a synchronization call, which may be referred to as (ftsync_i( )), prior to the operating system performing a OS set events call. In an embodiment, the ftsync_i( ) function provides for the synchronization operation described herein. One skilled in the art will appreciate that the subject code may be written in any suitable programming language. Additionally, one skilled in the art will readily appreciate that the code may be written in a number of different ways, having a number of different variations from the explicit code example provided below.

```
STATUS EVC_Set_Events(NU_EVENT_GROUP *event_group_ptr,
UNSIGNED events,
                                    OPTION operation)
{
R1 EV_GCB        *event_group;    /* Event control
block ptr */
R2 EV_SUSPEND    *suspend_ptr;    /* Pointer to
suspension blk */
R3 EV_SUSPEND    *next_ptr;       /* Pointer to next
suspend */
R4 EV_SUSPEND    *last_ptr;       /* Last suspension
block ptr */
UNSIGNED         consume;         /* Event flags to
consume */
UNSIGNED         compare;         /* Event comparison
variable */
INT              preempt;         /* Preemption
required flag */
NU_SUPERV_USER_VARIABLES
    /* Switch to supervisor mode */
    NU_SUPERVISOR_MODE( );
    /* Move input event group pointer into internal pointer. */
    event_group = (EV_GCB *) event_group_ptr;
    /* Synchronize with FT Partner if married and disable
interrupts. */
    ftsync_i(OS_SID);
    /* Protect against simultaneous access to the event group.
*/
    TCT_System_Protect( );
    /* Perform the specified operation on the current event flags
in the
        group. */
    if (operation & EV_AND)
        /* AND the specified events with the current events. */
        event_group -> ev_current_events =
            event_group -> ev_current_events &
events;
        else
        /* OR the specified events with the current events. */
        event_group -> ev_current_events =
            event_group -> ev_current_events |
events;
```

Figure 4:
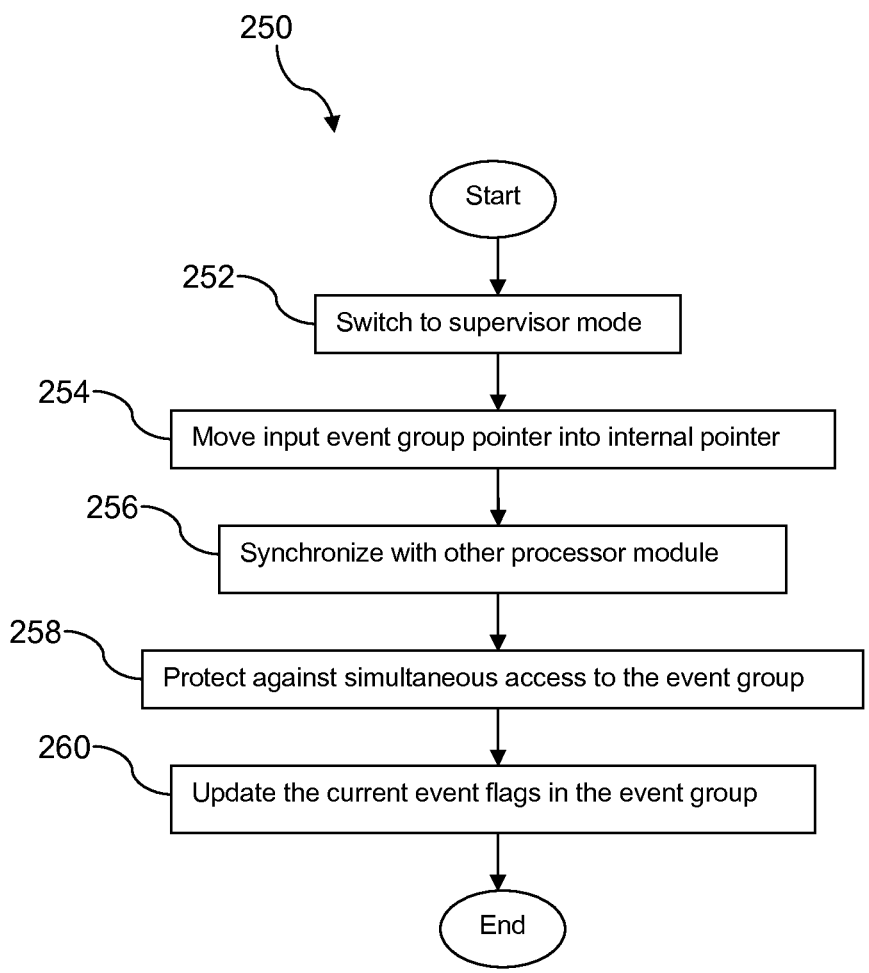
FIG. 4 is a flow chart of a method according to an embodiment of the disclosure.

Turning now to FIG. 4, a method 250 is described. The method 250 abstractly represents the exemplary code described above. In an embodiment, the method 250 is invoked or performed when the method EVC_Set_Events( ) described above is invoked. In an embodiment, the method 250 may be invoked prior to the method EVC_Set_Events( ) and/or prior to performing a call to the method EVC_Set_Events( ). At block 262, a switch to supervisor mode is performed. At block 254, the event group pointer is moved into an internal pointer, for example to the event_group pointer. At block 256, synchronization with the other processor module is performed by calling a synchronization subroutine or function. In an embodiment, the synchronization subroutine may be named ftsync_i( ). At block 258, simultaneous access to the event group is protected against, for example using an exclusive access mechanism such as a semaphore or other mechanism. At block 260, the current event flags in the event group are updated. The method 250 then exits. What is shown in FIG. 4 and in method 250 is that a synchronization between the processor modules may be performed before signal operating system calls are made, for example before the updating of current event flags or other operations such as sending a control command to the field device 104.

With reference again to FIG. 1, if the first processor module 102a reaches a given synch instruction in the common control application before the second processor module 102b, the first processor module 102a writes a synch message comprising its state value to the second synch state memory location 124b, reads the state value stored in the first synch state memory location 124a, determines that the state values in the synch state memory locations 124 disagree, and waits for the state value stored in the first synch state memory location 124a to be revised to correspond to the state value it wrote to the second synch state memory location 124b. The first processor module 102a may repeatedly read from the first synch state memory location 124a and perform the comparison. Alternatively, the first processor module 102a may periodically read from the first synch state memory location, for example every 100 μs, every 500 μs, every 1 ms, or some other periodic interval, and perform the comparison.

If the state value written by the first processor module 102a and the state value read by the first processor module 102a from the first synch state memory location 124a agree before the expiration of the predefined period of time, the first processor module 102a continues on executing subsequent instructions of the control application. If, however, the first processor module 102a experiences a synchronization time out, the first processor module 102a may begin a recovery routine to resynchronize with the second processor module 102b. The recovery routine may be referred to in some contexts as a resynchronization procedure or resynchronization function. In another circumstance, the second processor module 102b may reach a given synch instruction in the common control application before the first processor module 102a, and then the behavior of the first processor module 102a described above would instead by performed by the second processor module 102b.

In an embodiment, a resynchronization procedure or resynchronization function may comprise pausing control processing briefly and copying all the context of the first Ethernet frame having about 13 bytes of data. The communication link may be implemented with transformer coupling to promote electrical isolation between the two processor modules 102.

In an embodiment, the predetermined period of time or predefined time-out interval, which may also be referred to as the synchronization timeout period, may be in the range from 50 μs to 50 ms. Alternatively, in an embodiment, the synchronization timeout period may be in the range from 500 μs to 10 ms. In an embodiment, the synchronization timeout period may be about 2 ms. Alternatively, another synchronization timeout period may be employed. In combination with the present disclosure, one skilled in the art will readily select a predetermined period of time effective for synchronizing execution of the control program instructions between the processor modules 102. One consideration in determining the synchronization timeout period may be the frequency or granularity of the clocks 120 and/or the drift between the clocks 120.

It is understood that the clocks 120 are expected to drift with respect to each other: one clock 120 can be expected to operate faster than the other clock 120, even if only slightly faster. Because the processor modules 102 execute instructions at a pace set by their respective clocks 120, the instruction execution of the processor module 102 having the slower clock 120 will increasingly lag behind the instruction execution of the other processor module 102 until a synchronization timeout occurs. One of the results of resynchronizing the processor modules 102 may be resetting the time lag between the instruction executions of the two processor modules 102 to zero. After the resynchronization procedure, however, the processor module 102 having the slower clock 120 will increasingly lag behind the instruction execution of the other processor module 102 until synchronization timeout recurs, and this cycle will repeat itself. It is undesirable, generally, for resynchronization to recur periodically in the absence of true error conditions, because during resynchronization the dual redundant control processor is then not exercising control over the field devices 104. This is analogous to a car rolling down the road while the driver takes their hands off the steering wheel for an interval of time.

In an embodiment, if resynchronization happens too often, the two processor modules 102 execute a recovery procedure, for example establishing the processor module 102 that was formerly operating in shadow mode as operating in primary mode and establishing the processor module 102 that was formerly operating in primary mode as operating in shadow mode. The recovery procedure may further comprise performing diagnostics on the clock of the processor module 102 that has been determined to be inaccurate. The control program may invoke the recovery procedure when a predefined number of resynchronizations occurs within a predefined time window. For example, the control program may invoke the recovery procedure when more than 5 resynchronizations occur in a one minute time interval.

In an embodiment, the dual redundant control processor 109 automatically compensates for clock drift by having the processor module 102 that is operating in the shadow role periodically adjust its clock 120 to align with the clock 120 of the processor module 102 operating in the primary role, for example by adjusting its clock 120 to compensate for a time lag between the shadow clock 120 and the primary clock 120 or by adjusting its clock 120 to compensate for a time lead between the shadow clock 120 and the primary clock 120.

Automatic clock drift compensation may reduce the frequency of resynchronizations. Additionally, clock drift compensation may permit the reduction of the synchronization timeout period. For example, in the presence of clock drift, the synchronization timeout period may be set rather long to reduce the frequency of resynchronizations. As a result, more and more time is wasted by the processor module 102 having the faster clock 120. By reducing the synchronization timeout period, less time may be wasted by the processor module 102 having the faster clock 120. Additionally, when a problem does occur that causes the processor modules 102 to be out of synchronization, the out of synchronization condition can be detected and addressed more promptly.

In an embodiment, the processor module 102 operating in the shadow mode determines an average rate of clock drift between the two processor modules 102 and prophylactically corrects its own clock 120 to minimize the clock drift experienced. This may be referred to in some contexts as adjusting a rate of lead time per clock tick or a rate of lag time per clock tick. It is understood that the control application instructions may incorporate clock drift compensation instructions that are selectively executed by the processor module 102 executing in shadow mode and not executed by the processor module 102 executing in primary mode. In an embodiment, the control application may perform a synchronization instruction that promotes determining clock drift. In some contexts this synchronization instruction may be referred to as a clock tick synchronization. Said in other words, synchronizing for the purpose of determining clock drift between the two processor modules 102 may be referred to in some contexts as a clock tick synchronization.

In an embodiment, when a message is to be transmitted from the dual redundant process controller 109 to the DCS 112, both processor modules 102, which are assumed to be executing the instructions of the control application in synchronization with each other as described above, generate a message body and a cyclic redundancy check (CRC) value calculated over the message body. A synch message is exchanged between the two processor modules 102 indicating that a transmission is pending, and the processor module 102 operating in the shadow mode includes the value of the CRC that it calculated in the synch message that it transmits to the synch state memory location 124 of the processor module 102 operating in the primary mode.

The processor module 102 operating in the primary mode compares the CRC that it calculated to the CRC calculated by the processor module 102 operating in the shadow mode. If the CRCs agree, the processor module 102 operating in the primary mode transmits the message body and CRC to the DCS 112 and/or to the computer system 116. If the CRCs disagree, the processor module 102 operating in the primary mode does not transmit to the DCS 112 or to the computer system 116 at that time and instead performs a diagnostic procedure to determine why the two processor modules 102 calculated different CRCs. This event may indicate some error, and this functionality promotes correcting the error before propagating the error beyond the dual redundant process controller 109. It is understood that the message body and CRC transmitted by the processor module 102 may itself be encapsulated within a message body by a communication node in the network 110 and a CRC calculated by that communication node attached to the new message to support reliable communication between this network node and other network nodes in the network 110. The CRC determined by the processor module 102, notwithstanding, may be used by the DCS 112 and/or the computer system 116 to detect errors introduced into the message body produced by the processor module 102 as this message body transits the network 110.

In an embodiment, the messages to be transmitted from the dual redundant process controller 109 to the DCS 112 and/or to the computer system 116 may be transmitted from a message queue in the processor module 102. Messages that have passed the CRC comparison test described above may be accumulated on the message queue in the processor module 102, and the processor modules 102 may be able to return to processing the instructions of the control application rather than waiting for each message to be transmitted. The messages may be transmitted over the communication link between the processor module 102 operating in the primary mode to the network 110 as the communication link bandwidth allows, for example by a lower priority task of the control application and/or by a transceiver chip providing a message queue.

Figure 2:
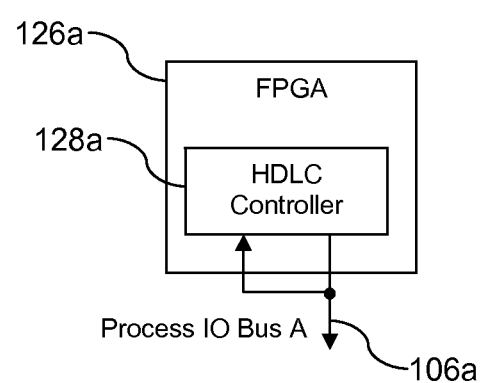
FIG. 2 is a block diagram of a portion of a processor module according to an embodiment of the disclosure.

Turning now to FIG. 2, further details of an embodiment of the FPGA 126 and the HDLC controller 128 are discussed. When the processor module 102 operating in the primary mode processes an output to be transmitted to the field device 104, the FPGA 126 forms a message body and a CRC calculated over the message body and sends both the message body and the CRC to the HDLC controller 128. The HDLC controller 128 formats the message body and the CRC into a HDLC frame that it then transmits over the process IO bus 106 to the field device 104. In an embodiment, the HDLC controller 128 concurrently receives the same HDLC frame that it transmits and compares the CRC value in the received HDLC frame with the CRC value it received from the FPGA 126. If the CRC values miscompare, the HDLC controller 128 alerts the FPGA 126, and the FPGA 126 may perform an error recovery process. This checking of HDLC frame CRCs may promote more rapid correction of an error and more prompt restoration of normal communication with the field device 104.

It will be understood that the several innovations discussed above each contribute to promoting fault tolerant computing. Additionally, the specific features and techniques described do not depend on specialized hardware but may be implemented using off-the-shelf components, which may be referred to as using generic hardware. While in an embodiment each of the several described innovations may be incorporated into a dual redundant process controller 109, it is understood that other embodiments of a dual redundant process controller 109 that incorporate one or a reduced selection of the several described innovations are also contemplated by the present disclosure.

Figure 3:
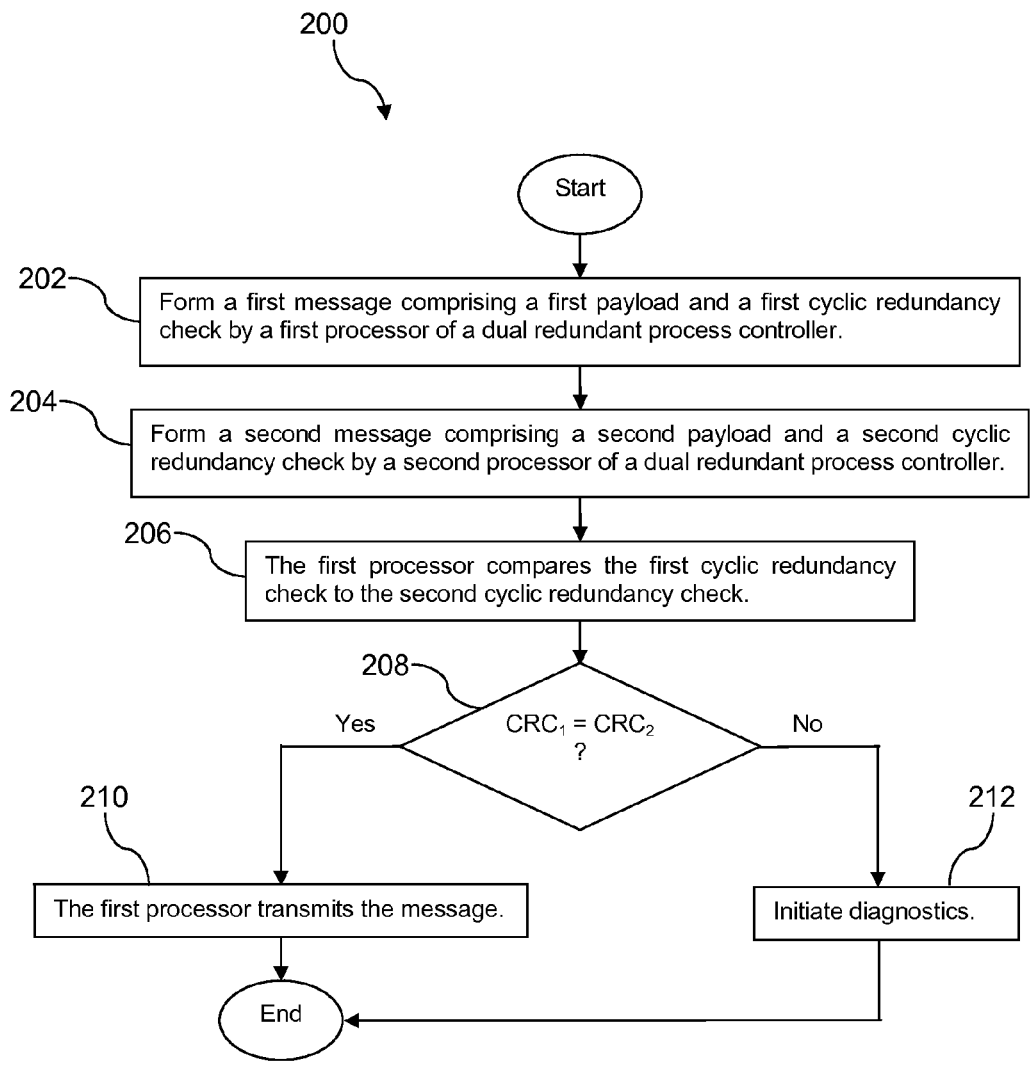
FIG. 3 is a flow chart of a method according to an embodiment of the disclosure.

Turning now to FIG. 3, a method 200 is discussed. At block 202, a first message for transmitting from the dual redundant process controller 109 to the DCS 112 and/or the computer system 116 is formed and/or composed by the first processor module 102a operating in the primary mode. The first message comprises a first payload and a first cyclic redundancy check (CRC). The first CRC is calculated over the first payload by the first processor module 102a. At block 204, a second message is formed and/or composed by the second processor module 102b operating in the shadow mode. The second message comprises a second payload and a second cyclic redundancy check (CRC). The second CRC is calculated over the second payload by the second processor module 102b. In an embodiment, the second processor module 102b may transmit the second CRC to the first processor module 102a, for example in a synch message transmitted to the synch state memory location 124a of the first processor module 102a. It is understood that the processing of blocks 202 and 204 may occur at substantially the same time or that the processing of block 204 may occur slightly before the processing of block 202.

At block 206, the first processor module 102a compares the first CRC to the second CRC. At block 208, the execution of the first processor module 102a branches to one of two processing paths based on the result of the comparison of CRCs. If the CRCs compare, the processing proceeds to block 210 in which the first processor module 102a transmits the first payload and the first CRC to the DCS 112 and/or the computer system 116. If the CRCs miscompare, the processing proceeds to block 212 in which the first processor module 102a initiates diagnostics. It is understood that the term payload employed with reference to the description of method 200 corresponds to the term message body used in the description above with reference to FIG. 1.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A dual redundant process controller, comprising:
a first processor;
a first memory;
a first instance of a multitasking real-time operating system (RTOS);
a first instance of a process control application stored in the first memory;
a second processor;
a second memory;
a second instance of the multitasking real-time operating system; and
a second instance of the process control application stored in the second memory,
wherein, when executed by the first processor in a context provided by the first instance of the multitasking real-time operating system, the first instance of the process control application:
writes a first synchronization information to the second memory using a synchronization function provided by the first instance of the multitasking real-time operating system,
reads a second synchronization information from the first memory,
performs a resynchronization function when the second synchronization information disagrees with the first synchronization information after passage of a predetermined time-out interval, and
calls the synchronization function provided by the first instance of the multitasking real-time operating system before invoking a set events function provided by the first instance of the multitasking real-time operating system, and
wherein, when executed by the second processor, the second instance of the process control application:
writes the second synchronization information to the first memory using the synchronization function provided by the second instance of the multitasking real-time operating system,
reads the first synchronization information from the second memory, and
performs the resynchronization function when the first synchronization information disagrees with the second synchronization information after passage of the predetermined time-out interval.

2. The controller of claim 1, wherein the first synchronization information is written to the second memory via an Ethernet transmission from the first processor to the second processor and wherein the second synchronization information is written to the first memory via an Ethernet transmission from the second processor to the first processor.

3. The controller of claim 1, wherein the process control application comprises a state sequencer, wherein the first instance of the process control application executes a first state sequencer that tracks the execution state of the first instance of the process control application, and wherein the second instance of the process control application executes a second state sequencer that tracks the execution state of the second instance of the process control application.

4. The controller of claim 3, wherein the first instance of the state sequencer determines the first synchronization information and wherein the second instance of the state sequencer determines the second synchronization information.

5. The controller of claim 1, wherein the synchronization function provided by the first instance of the multitasking real-time operating system promotes synchronizing on a clock tick generated by the first instance of the multitasking real-time operating system.

6. A dual redundant process controller, comprising:
a first processor;
a first memory;
a first instance of a multitasking real-time operating system (RTOS);
a first instance of a process control application stored in the first memory;
a second processor;
a second memory;
a clock;
a second instance of the multitasking real-time operating system; and
a second instance of the process control application stored in the second memory,
wherein, when executed by the first processor in a context provided by the first instance of the multitasking real-time operating system, the first instance of the process control application:
  writes a first synchronization information indicating a clock tick synchronization to the second memory using a synchronization function provided by the first instance of the multitasking real-time operating system,
  writes a second synchronization information to the second memory using the synchronization function provided by the multitasking real-time operating system,
  reads a third synchronization information from the first memory, and
    performs a resynchronization function when the third synchronization information disagrees with the second synchronization information after passage of a predetermined time-out interval, and
wherein, when executed by the second processor, the second instance of the process control application adjusts the clock based on the first synchronization information stored in the second memory.

7. The controller of claim 6, further comprising a high-level data link control (HDLC) communication controller coupled to the first processor, wherein the first instance of the multitasking real-time operating system further:
  forms a first message comprising a first data payload and a first cyclic redundancy check (CRC), and
  transmits the first message to the high-level data link control communication controller, and
  wherein the high-level data link control communication controller is configured to:
    receive the first message,
    transmit the first message to a field device,
    receive the transmitted first message,
    calculate a second cyclic redundancy check based on receiving the transmitted first message, and
    transmit an error message to the first processor when the second cyclic redundancy check is different from the first cyclic redundancy check.

8. The controller of claim 6, wherein the second synchronization information and third synchronization information are exchanged to synchronize state between the first and the second instance of the process control application.

9. The controller of claim 8, wherein the process control application comprises a state sequencer, wherein the first instance of the process control application executes a first state sequencer that tracks the execution state of the first instance of the process control application, and wherein the second instance of the process control application executes a second state sequencer that tracks the execution state of the second instance of the process control application.

10. The controller of claim 6, wherein the first synchronization information is written to the second memory via an Ethernet transmission from the first processor to the second processor.

* * * * *